(12) United States Patent
Takayasu

(10) Patent No.: US 6,878,631 B2
(45) Date of Patent: Apr. 12, 2005

(54) ABRASIVE USED FOR PLANARIZATION OF SEMICONDUCTOR DEVICE AND METHOD OF MANUFACTURING SEMICONDUCTOR DEVICE USING THE ABRASIVE

(75) Inventor: Jun Takayasu, Yokkaichi (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/269,996

(22) Filed: Oct. 15, 2002

(65) Prior Publication Data

US 2004/0036149 A1 Feb. 26, 2004

(30) Foreign Application Priority Data

Aug. 22, 2002 (JP) .................................... 2002-242041

(51) Int. Cl.[7] .................... H01L 21/302; H01L 21/461
(52) U.S. Cl. ..................................................... 438/693
(58) Field of Search .......................... 257/626; 438/690, 438/691, 692, 693, 689, 471, 472, 473, 474, 475, 476, 114, 465

(56) References Cited

U.S. PATENT DOCUMENTS 4,971,602 A * 11/1990 Crawford .................... 51/293

FOREIGN PATENT DOCUMENTS

| EP | 571865 A1 | * 12/1993 |
| JP | 56084782 A | * 7/1981 |
| JP | 9-321003 | 12/1997 |
| JP | 10-135163 | 5/1998 |

* cited by examiner

Primary Examiner—Hoai Pham
Assistant Examiner—Dana Farahani
(74) Attorney, Agent, or Firm—Finnegan, Henderson, Farabow, Garrett & Dunner, L.L.P.

(57) ABSTRACT

An abrasive for a semiconductor device comprises cerium oxide particles and coating materials. The cerium oxide particles are made principally of cerium oxide ($CeO_2$). The coating materials cover the surface of the cerium oxide particles.

8 Claims, 4 Drawing Sheets

ABRASIVE USED FOR PLANARIZATION OF SEMICONDUCTOR DEVICE AND METHOD OF MANUFACTURING SEMICONDUCTOR DEVICE USING THE ABRASIVE

CROSS-REFERENCE TO RELATED APPLICATIONS

This application is based upon and claims the benefit of priority from the prior Japanese Patent Application No. 2002-242041, filed Aug. 22, 2002, the entire contents of which are incorporated herein by reference.

BACKGROUND OF THE INVENTION

1. Field of the Invention

The present invention relates to semiconductor device planarization technology in the field of semiconductor device manufacturing.

2. Description of the Related Art

In semiconductor device manufacturing, an abrasive composed of cerium oxide ($CeO_2$) particles has been used for polishing an insulating film, particularly in CMP (Chemical Mechanical Polishing) for forming STI (Shallow Trench Isolation). In this case, a surfactant is added to disperse the cerium oxide particles. The degree of dispersion is adjusted by the type and amount of surfactant.

However, dispersion can become cohesion, depending upon the amount of surfactant added. The amount of surfactant is sometimes intentionally increased in order to enhance the effect of planarization. But, this induces cohesion of the cerium oxide particles. This causes scratches on the insulating film surface. Further, a high amount of surfactant will lower the polishing rate, and decrease the throughput in a polishing process.

BRIEF SUMMARY OF THE INVENTION

According to one aspect of the present invention, there is provided an abrasive for a semiconductor device comprising cerium oxide particles, and materials for coating the surface of the cerium oxide particles.

According to another aspect of the present invention, there is provided a method of manufacturing a semiconductor device comprising a process of polishing the surface of a thin film formed on a semiconductor substrate by using abrasive particles consisting of cerium oxide particles coated with coating materials.

DETAILED DESCRIPTION OF THE INVENTION

Figure 1:
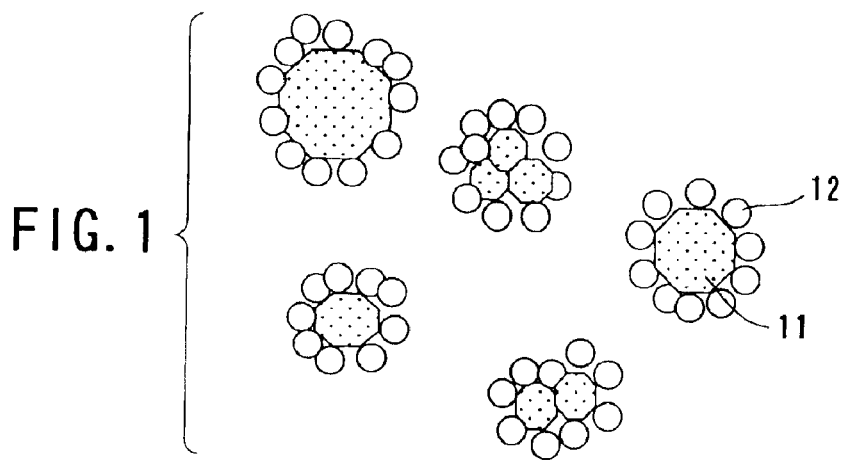
FIG. 1 is a schematic view illustrating an abrasive particle included in an abrasive for a semiconductor device according to a first embodiment of the prevent invention.

Embodiments of the present invention will now be explained with reference to the accompanying drawings. In all drawings, the same reference numerals are given to the same parts or elements.

Embodiment 1

Description will be given on an abrasive for a semiconductor device according to a first embodiment of the present invention, and a method of polishing a semiconductor device using the abrasive. This method uses an abrasive consisting of cerium oxide ($CeO_2$) particles coated with silicon oxide ($SiO_2$). The silicon oxide may be in the form of particles or a film.

FIG. 1 illustrates abrasive particles contained in the abrasive used by the method of polishing a semiconductor device according to a first embodiment of the invention. As illustrated, a cerium oxide ($CeO_2$) particle 11 is coated by silicon oxide ($SiO_2$) particles 12.

Repulsion of silicon oxide 12 disperses the abrasive particles. Thus, it is unnecessary to add a surfactant to the abrasive, after coating the cerium oxide ($CeO_2$) particles 11 in silicon oxides ($SiO_2$) 12. Add KOH or ammonia in stead to adjust pH of the abrasive. An additive may be used in order to enhance the polishing effect.

Figure 2:
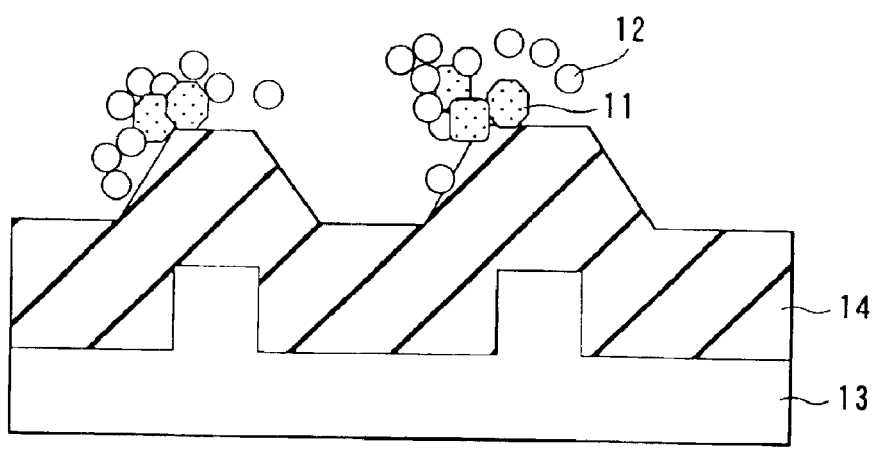
FIG. 2 is a schematic diagram showing a first step of a method of polishing a semiconductor device according to the first embodiment of the invention.
Figure 3:
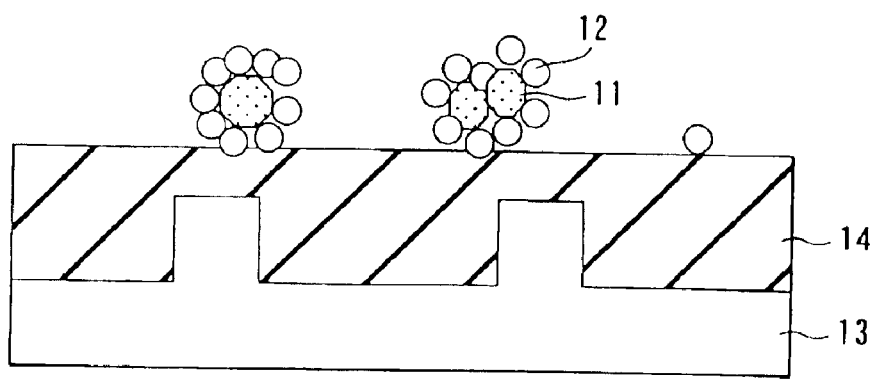
FIG. 3 is a schematic diagram showing a second step of the method of polishing a semiconductor device according to the first embodiment of the invention.

FIG. 2 and FIG. 3 schematically show the method of polishing a semiconductor device according to the first embodiment.

Description will now be give on a method of polishing an insulating film 14 formed on a semiconductor substrate 13 to make the surface of the insulating film 14 plane, by using the abrasive particles consisting of cerium oxide particles 11 coated by silicon oxide particles 12, as shown in FIG. 1.

When the polishing starts, the abrasive particle collides with a projection of the insulating film 14, as shown in FIG. 2. By this collision, the silicon oxide particles 12 coating the cerium oxide particles 11 separate from the cerium oxide particles 11. As a result, the surface of the insulating film 14 is polished mainly by the cerium oxide particle 11. That is, the surface of the cerium oxide particle 11 is exposed, scrubbing the projection of the insulating film 14, thereby polishing the insulating film 14.

In the above-mentioned polishing process, polishing is achieved mainly by a cerium oxide particle 11, and extreme reduction of the polishing rate does not occur on the polishing surface. Further, as the abrasive contains no surfactant, cohesion of the abrasive particles remaining in a concave on the polishing surface does not occur. Therefore, the abrasive particle diameter is not increased by cohesion, and the number of scratches can be reduced.

As the polishing of the projection on the insulating film 14 advances, the number of silicon oxide particles 12 separated from the cerium oxide particles 1 is gradually decreased. And, when the projection of the insulating film 14 is completely polished and the film surface becomes plane, no more silicon oxide particles 12 separate from the cerium oxide particle 11, as shown in FIG. 3. In this case, the surface of the insulating film 14 is polished by the silicon oxide particles 12 coating the surface of the cerium oxide particle 11, and the polishing rate is determined by the silicon oxide particles 12.

If the abrasive is continuously supplied, and the conditioning of the emery cloth surface is made simultaneously with the polishing, if necessary, the cerium oxide particle 11 whose surface is exposed by separation of the silicon oxide particle 12 can be driven out of the polishing process. This makes it possible to use only the abrasive particles consisting of the cerium oxide particles 11 coated by silicon oxide particles 12, for polishing the surface of the insulating film 14, after planarization of the surface thereof.

Namely, the polishing is made by the cerium oxide particle 11 having the fast polishing rate until the polishing surface becomes plane, and the silicon oxide particles 12 are used after the surface becomes plane. This will highly reduce the polishing rate after the planarization, and actuate the self-stop function in polishing the uneven surface. Moreover, when using the abrasive particles consisting of the cerium oxide particles 11 coated by silicon oxide particles 12, the polishing will continue still after the polished becomes plane. This method is also suitable when the polished film thickness needs to be adjusted.

As described above, according to the first embodiment of the invention, cerium oxide particles are used for polishing until an uneven portion on the surface to be polished becomes plane, and silicone oxide particles are used after the planarization process. This method enables polishing without lowering the polishing rate in the planarization process, and realizes polishing with a lowered polishing rate in the polishing process after the planarization. In addition, there is no need to add a surfactant to the abrasive, and generation of scratches on the polished surface can be prevented.

Embodiment 2

Description will now be given on an abrasive for a semiconductor device according to a second embodiment of the present invention, and a method of polishing a semiconductor device using the abrasive. The abrasive consists of cerium oxide ($CeO_2$) particles coated with aluminum oxide ($Al_2O_3$). The aluminum oxide may be in a particle or film form. In the polishing method, a semiconductor device is polished using an abrasive containing the abrasive particles.

Figure 4:
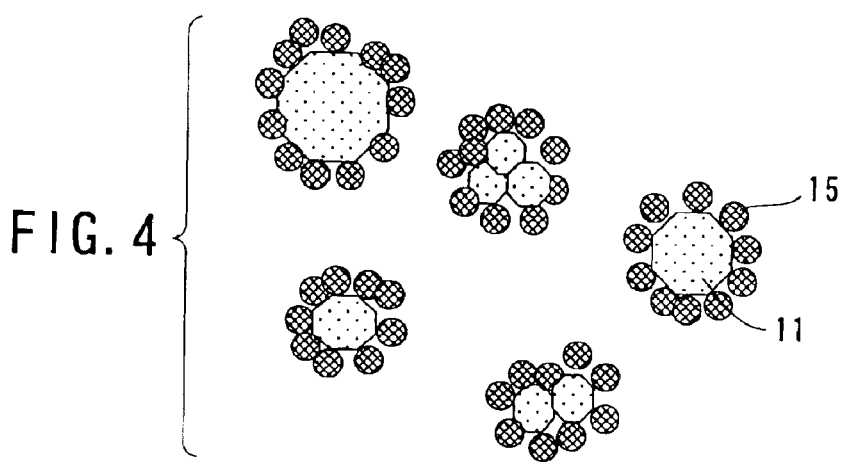
FIG. 4 is a schematic view illustrating an abrasive particle included in an abrasive for a semiconductor device according to a second embodiment of the prevent invention.

FIG. 4 illustrates abrasive particles contained in the abrasive used by the method of polishing a semiconductor device according to a second embodiment of the invention. As illustrated, a cerium oxide ($CeO_2$) particle 11 is coated by aluminum oxide ($Al_2O_3$) particles 15.

Repulsion of silicon oxides 12 disperses the abrasive particles. Thus, it is unnecessary to add a surfactant to the abrasive containing abrasive particles, after coating the cerium oxide ($CeO_2$) particle 11 with aluminum oxide ($Al_2O_3$) 12. Add appropriate acid in stead to adjust pH of the abrasive. An additive may be added in order to enhance the polishing effect.

Figure 5:
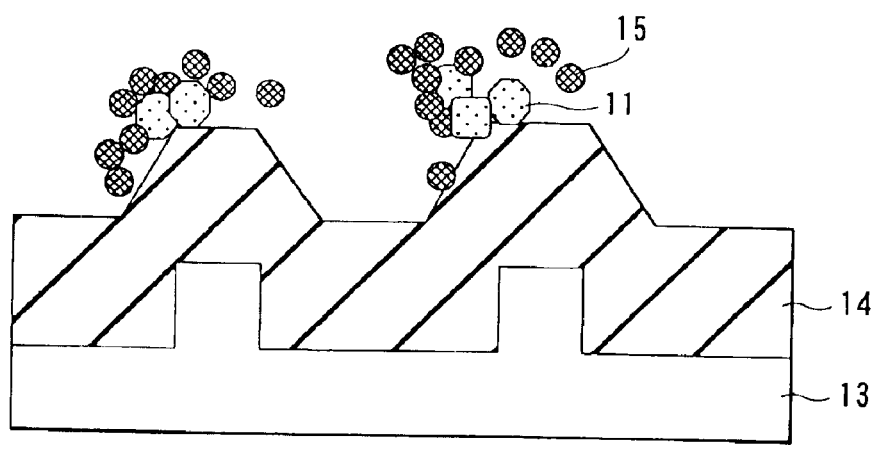
FIG. 5 is a schematic diagram showing a first step of a method of polishing a semiconductor device according to the second embodiment of the invention.
Figure 6:
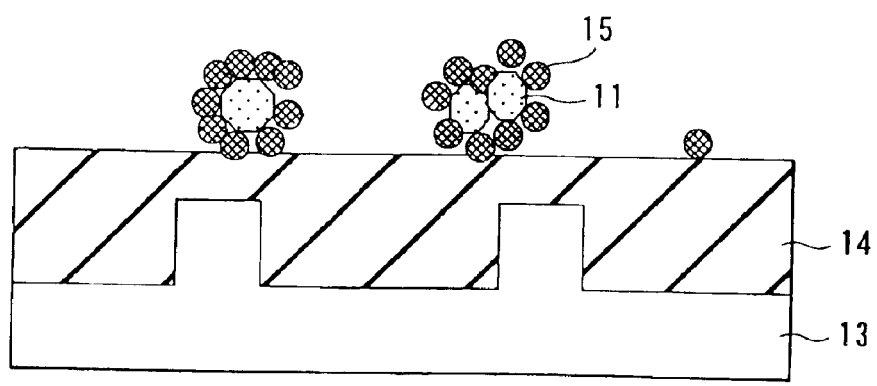
FIG. 6 is schematic diagram showing a second step of the method of polishing a semiconductor device according to the second embodiment of the invention.

FIG. 5 and FIG. 6 schematically show the method of polishing a semiconductor device according to the second embodiment.

Description will now be give on a method of polishing an insulating film 14 formed on a semiconductor substrate 13 to make the surface of the insulating film 14 plane, by using the abrasive consisting of cerium oxide particles 11 coated with aluminum oxide ($Al_2O_3$) particles 15, as shown in FIG. 4.

When the polishing starts, the abrasive particles collide with a projection on the insulating film 14, as shown in FIG. 5. By this collision, the aluminum oxide particles 15 coating the cerium oxide particles 11 separate from the cerium oxide particles 11. As a result, the surface of the insulating film 14 is polished mainly by the cerium oxide particles 11. That is, the surface of the cerium oxide particle 11 is exposed, scrubbing the projection of the insulating film 14, thereby polishing the insulating film 14.

In the above-mentioned polishing process, polishing is achieved mainly by cerium oxide particles 11, and extreme reduction of the polishing rate does not occur on the polishing surface. Further, as the abrasive contains no surfactant, cohesion of the abrasive particles remaining in a concave on the polishing surface does not occur. Therefore, the abrasive particle diameter is not increased by cohesion, and the number of scratches can be reduced.

As the polishing of the projection on the insulating film 14 advances, the number of aluminum oxide particles 15 separated from the cerium oxide particle 11 is gradually decreased. And, when the projection of the insulating film 14 is completely polished and the film surface becomes plane, no more aluminum oxide particles 15 separate from the cerium oxide particles 11, as shown in FIG. 6. The surface of the insulating film 14 is thus polished by the aluminum oxide particle 15 coating the surface of the cerium oxide particle 11, and the polishing rate is determined by the aluminum oxide particles 15.

If the abrasive is continuously supplied, and the conditioning of the emery cloth surface is made simultaneously with the polishing, if necessary, the cerium oxide particle 11 whose surface is exposed by separation of the aluminum oxide particles 15 can be driven out of the polishing process. This makes it possible to use only the abrasive particles consisting of cerium oxide particles 11 coated by aluminum oxide particles 15, for polishing the surface of the insulating film 14, after planarization of the surface thereof.

Namely, the polishing is made by the cerium oxide particle 11 having the fast polishing rate until the polishing surface becomes plane, and the aluminum oxide particle 15 is used after the surface becomes plane. This will highly reduce the polishing rate after the planarization, and actuate the self-stop function in polishing the uneven surface. Moreover, when using the abrasive particles consisting of cerium oxide particles 11 coated by aluminum oxide particles 15, the abrasive containing these abrasive particles becomes acid. Thus, the silicon oxide film ($SiO_2$) film is substantially not polished by the aluminum oxide particle 15. Therefore, this method is suitable when only planarization is required.

As described above, according to the second embodiment of the invention, cerium oxide particles are used for polishing until an uneven portion on the surface to be polished becomes plane, and aluminum oxide particles are used after the planarization process. This method enables polishing without lowering the polishing rate in the planarization process, and realizes polishing with a lowered polishing rate in the polishing process after the planarization. In addition, there is no need to add a surfactant to the abrasive, and generation of scratches on the polished surface can be prevented.

Description will now be given on the results of the polishing made by using a conventional abrasive containing silicone oxide (silica) particles or aluminum oxide ($Al_2O_3$) particles, and the abrasive made of cerium oxide ($CeO_2$) coated with silicon oxide ($SiO_2$) particles of the first embodiment, and the abrasive made of cerium oxide ($CeO_2$) and coated by aluminum oxide ($Al_2O_3$) particles of the second embodiment.

Table 1 shows the properties of the abrasives containing conventional abrasive particles, and abrasive particles of the embodiments, and the polishing rates and the number of scratches occurred when these abrasives are used for polishing.

Next, the polishing of a silicon oxide film having an uneven surface will be explained.

Figure 8:
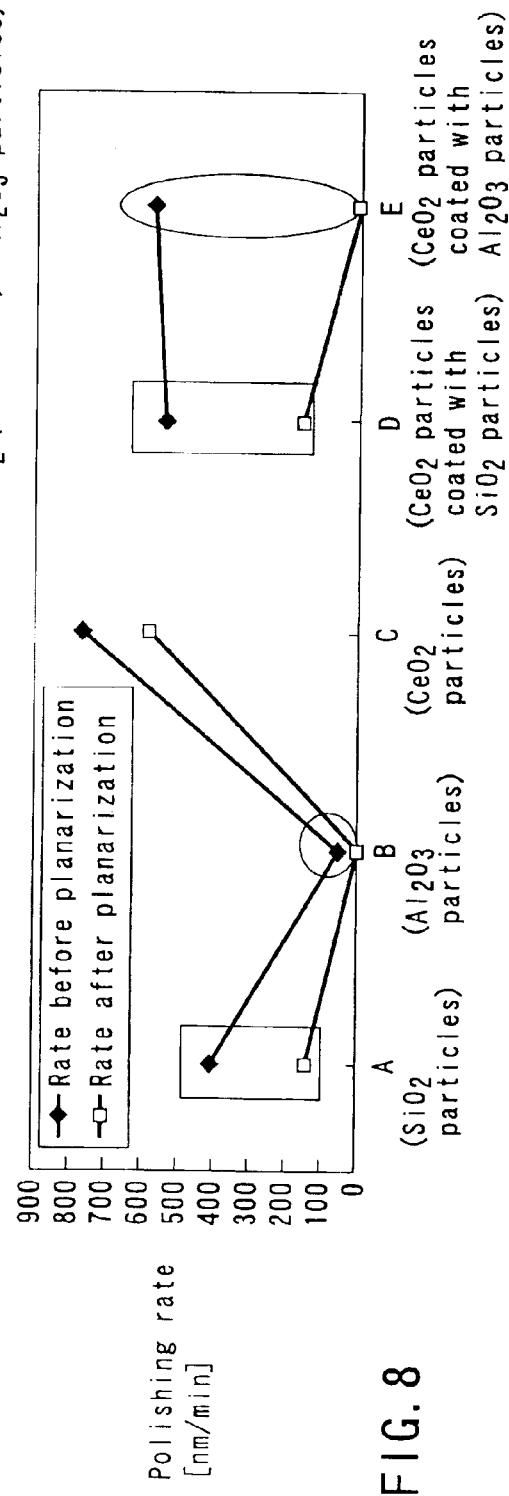
FIG. 8 is a graph showing the polishing rates when polishing a patterned film by using a conventional abrasive and the abrasive of the first and second embodiments of the present invention.
Figure 9:
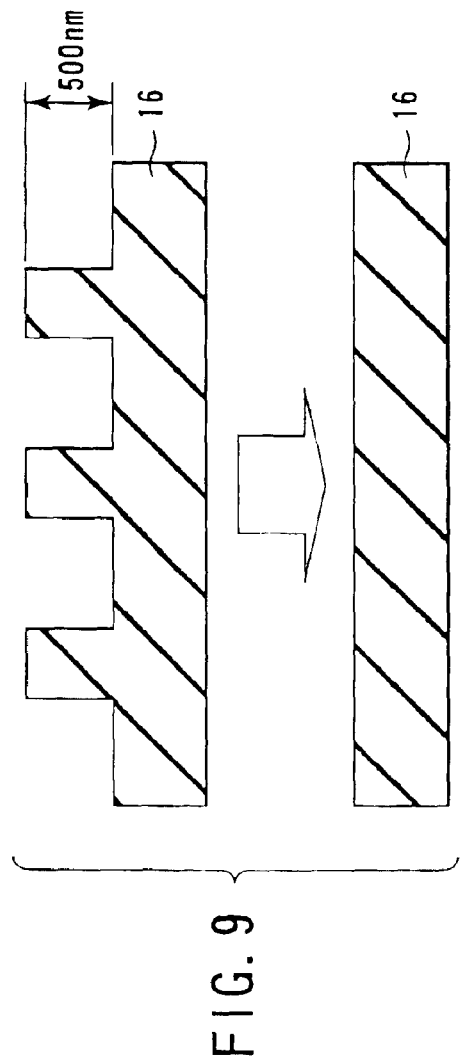
FIG. 9 shows sectional views of the patterned film before and after the planarization.

FIG. 8 shows the polishing rates when polishing a patterned silicon oxide film by using the abrasives A–E. The silicon oxide film is a TEOS (Tetraethylorthosilicate) film formed by low pressure CVD. The TEOS film 16 has unevenness on the surface to be polished, as shown in FIG. 9. The density of the projections to the whole surface is approximately 40%, and the height of the projections is about 500 nm.

Before the surface is polished to be planar, the polishing rate with the abrasive C containing cerium oxide particles is equivalent to the polishing rate of abrasive D, containing the abrasive consisting of cerium oxide particles coated with silicon oxide particles, or the rate of abrasive E containing the abrasive consisting of cerium oxide particles coated with aluminum oxide particles. However, after the polished surface becomes plane, the polishing rate with the abrasive D

TABLE 1

| Slurry | pH | Particles density [%] | Non-patterned silicon oxide film Polishing rate [nm/min] | Patterned silicon oxide film | | Scratch* [quantity/ 8" φ wf] |
| --- | --- | --- | --- | --- | --- | --- |
| | | | | Rate before planarization [nm/min] | Rate after planarization [nm/min] | |
| Silicon oxide particles | 11.0 | 5 | 132 | 411 | 142 | 1 |
| $Al_2O_3$ particles | 2.5 | 0.5 | 1 | 52 | 3 | 65 |
| $CeO_2$ particles | 8.1 | 0.5 | 610 | 769 | 586 | 84 |
| $CeO_2$ particles coated with $SiO_2$ particles | 10.5 | 0.5 | 198 | 541 | 157 | 2 |
| $CeO_2$ particles coated with $Al_2O_3$ particles | 2.7 | 0.5 | 6 | 576 | 13 | 25 |

*Relative value assuming 1 for silicon oxide particles

Abrasive A indicates an abrasive containing silicon oxide particles, abrasive B indicates an abrasive containing aluminum oxide ($Al_2O_3$) particles, abrasive C indicates an abrasive containing cerium oxide ($CeO_2$) particles, abrasive D indicates an abrasive containing the abrasive particles consisting of cerium oxide ($CeO_2$) particles coated by silicon oxide ($SiO_2$) particles, and abrasive E indicates an abrasive containing the abrasive particle consisting of cerium oxide ($CeO_2$) particles coated by aluminum oxide ($Al_2O_3$) particles.

Figure 7:
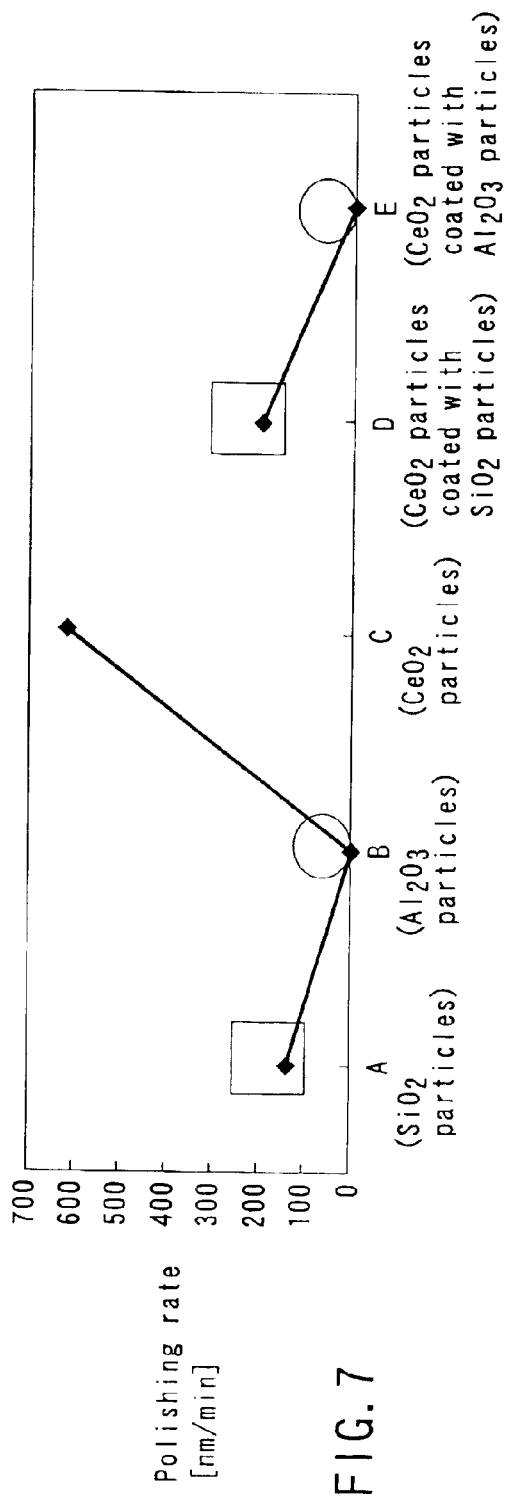
FIG. 7 is a graph showing the polishing rates when polishing a non-patterned film by using a conventional abrasive and the abrasives of the first and second embodiments of the present invention.

FIG. 7 shows the polishing rates when a silicon oxide film is polished by using the abrasives A–E. Where, the silicon oxide film, i.e., the film to be polished is a film having no uneven portions. As polishing conditions, the pressure (DF) applied to the polished surface of the silicon oxide film is 400 [hPa], the speed of the carrier holding the wafer is 100 [rpm], and the speed of the turntable is 100 [rpm]. These polishing conditions are the same in the subsequent polishing processes.

The polishing rate is 610 [nm/min] in the polishing with the abrasive C containing cerium oxide particles, 198 [nm/min] with the abrasive D containing the abrasive particles composed of cerium oxide particles coated by silicon oxide particles, and 6 [nm/min] with the abrasive E containing the abrasive particles composed of cerium oxide particles coated by aluminum oxide particles. Therefore, the polishing rate can be sufficiently lowered by using the abrasive D or E when polishing a silicon oxide film having a plane surface, compared to using the abrasive C.

is extremely lowered, and becomes equivalent to the rate with the abrasive A containing silicon oxide film particles. Similarly, the polishing rate with the abrasive E is extremely lowered, and becomes equivalent to the rate with the abrasive B containing aluminum oxide particles.

However, after the polished surface becomes plane, the polishing rate with the abrasive D is highly reduced, and becomes equal to the rate of abrasive A containing silicon oxide film particles. Similarly, the polishing rate of abrasive E is highly reduced, and becomes equal to the rate of abrasive B containing aluminum oxide particles.

The amount of scratching on the silicon oxide film (TEOS film) was as follows.

Figure 10:
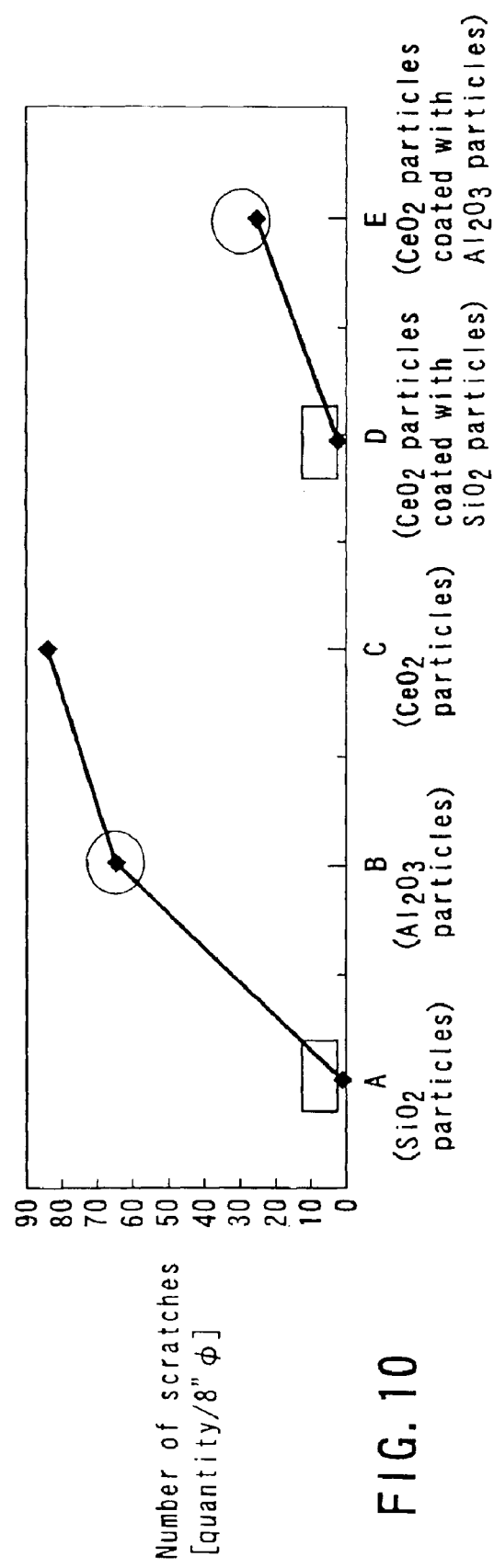
FIG. 10 is a graph showing the number of scratches occurred on the patterned film surface when a conventional abrasive and the abrasives of the first and second embodiments of the present invention are used.

FIG. 10 shows the number of scratches that occurred when abrasives A–E were used for polishing the silicon oxide film. The silicon oxide film is a TEOS film having unevenness on the surface to be polished, as described above. The number of scratches is indicated by a relative value, assuming the number of scratches that occurs when polishing with abrasive A containing silicon oxide particles to be 1.

The number of scratches when polishing with abrasive D containing the abrasive composed of cerium oxide particles coated with silicon oxide particles, is equivalent to the that of abrasive A containing silicon oxide particles. The number of scratches when polishing with the abrasive E containing the abrasive particles composed of cerium oxide particles coated by aluminum oxide particles is lower than that of abrasive B containing aluminum oxide particles. This is because, cerium, i.e., the base material of abrasive E, is soft.

Based on the above results, it is apparent that polishing is possible without lowering the polishing rate, in the process of polishing an uneven surface. Further, the polishing rate can be lowered in a process after planarization. In addition, there is no need to add a surfactant to the abrasive, and the number of scratches to occur on the polished surface can be reduced.

In the prior art, when polishing an uneven surface of a thin film with cerium oxide particles, a surfactant causes cohesion of the cerium oxide particles, and this causes scratches. Further, as a large amount of surfactant is added, the polishing rate is lowered and the throughput is decreased.

In the embodiments of the present invention, CMP is used for a thin film, using an abrasives consisting of a base material of cerium oxide particles, coated with $SiO_2$ or $Al_2O_3$ particles. The coating particles separate from the base material, eliminating the necessity to add a surfactant, and the throughput of the polishing process is not decreased. Moreover, cohesion of particles does not occur, and no scratches occur. The planarization effect can thus be much increased by using appropriate coating particles.

The embodiments can be implemented either individually or in combination. Each embodiment includes the invention of various steps, and these various steps can also be extruded by combining a plurality of elements disclosed in each embodiment.

As described above, according to the embodiments of the present invention, it is possible to provide an abrasive for a semiconductor device which decreases the number of scratches and prevents lowering of the polishing rate, and a method of manufacturing a semiconductor device using the abrasive.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An abrasive for a semiconductor device, comprising:
   cerium oxide particles made principally of cerium oxide; and
   coating materials to coat the surface of said cerium oxide particles.

2. The abrasive for a semiconductor device according to claim 1, wherein said coating materials are in the form of particles.

3. The abrasive for a semiconductor device according to claim 1, wherein said coating materials are in the form of a thin film.

4. The abrasive for a semiconductor device according to claim 1, wherein said coating materials are composed principally of silicon oxide ($SiO_2$).

5. The abrasive for a semiconductor device according to claim 1, wherein said coating materials are composed principally of aluminum oxide ($Al_2O_3$).

6. The abrasive for a semiconductor device according to claim 1, wherein said cerium oxide is made principally of $CeO_2$.

7. The abrasive for a semiconductor device according to claim 4, wherein said cerium oxide is made principally of $CeO_2$.

8. The abrasive for a semiconductor device according to claim 5, wherein said cerium oxide is made principally of $CeO_2$.

* * * * *